United States Patent [19]
Burlison et al.

[11] Patent Number: 5,694,063
[45] Date of Patent: Dec. 2, 1997

[54] HIGH SPEED $I_{DDQ}$ MONITOR CIRCUIT

[75] Inventors: Phillip D. Burlison, Morgan Hill; William R. DeHaven, Los Altos; Victor Pogrebinsky, San Jose, all of Calif.

[73] Assignee: LTX Corporation, Westwood, Mass.

[21] Appl. No.: 721,973

[22] Filed: Sep. 27, 1996

Related U.S. Application Data

[63] Continuation of Ser. No. 572,352, Dec. 14, 1995, abandoned, which is a continuation of Ser. No. 288,917, Aug. 11, 1994, abandoned.

[51] Int. Cl.$^6$ .............................. H03D 1/00; G01R 19/00; H02M 11/00; G05F 1/10
[52] U.S. Cl. .............................. 327/50; 327/52; 327/94; 327/103; 327/538
[58] Field of Search ........................... 327/50, 52, 94, 327/387, 389, 392, 395, 396, 336, 337, 91, 96, 56, 58, 62, 63, 65, 103, 535, 538; 324/73.1, 763, 764, 765, 769, 158.1

[56] References Cited

U.S. PATENT DOCUMENTS

| | | | |
|---|---|---|---|
| 4,782,290 | 11/1988 | Sakai et al. | 324/765 |
| 5,059,889 | 10/1991 | Heaton | 323/285 |
| 5,128,567 | 7/1992 | Tanaka et al. | 327/404 |
| 5,216,289 | 6/1993 | Hahn et al. | 327/108 |
| 5,319,258 | 6/1994 | Ruetz | 327/108 |
| 5,332,973 | 7/1994 | Brown et al. | 324/537 |
| 5,371,457 | 12/1994 | Lipp | 324/158.1 |
| 5,398,318 | 3/1995 | Hiraishi et al. | 327/108 |
| 5,412,263 | 5/1995 | Nagaraj et al. | 327/566 |

OTHER PUBLICATIONS

PCT International Search Report, 5 pages.
K. M. Wallquist, A. W. Righter, and C.F. Hawkins, *A General Purpose IDDQ Measurement Circuit*, IEEE, 1993 Int'l Test Conference, pp. 642–651.
L. Horning, J. Soden, R. Fritzemeier & C. Hawkins, *Measurements of Quiescent Power Supply Current For CMOS ICs In Production Testing*, IEEE, 1987 Int'l Test Conference, pp. 300–309.
C. Crapuchettes, *Testing CMOS Idd on Large Devices*, IEEE, 1987 Int'l Test Conference, pp. 310–315.
M. Keating & D. Meyer, *A New Approach To Dynamic Idd Testing*, IEEE, 1987 Int'l Test Conference, pp. 316–321.
S. McEuen, *Why IDDQ*, IEEE, 1990 Int'l Test Conference, p. 252.
K. Baker & B. Verhelst, *Iddq Testing Because "Zero Defects Isn't Enough"*, IEEE, 1990 Int'l Test Conference, pp. 253–524.
J. Soden, R. Fritzemeier & C. Hawkins, *Zero Defects or Zero Stuck-At Faults—CMOS IC Process Improvement With Iddq*, IEEE, 1990 Int'l Test Conference, pp. 255–256.
W. Maly, *Current Testing*, IEEE, 1990 Int'l Test Conference, p. 257.
S. Bollinger & S. Midkiff, *On Test Generation For Iddq Testing Of Bridging Faults In CMOS Circuits*, IEEE, 1991 Int'l Test Conference, pp. 598–607.

(List continued on next page.)

*Primary Examiner*—David C. Nelms
*Assistant Examiner*—Trong Quang Phan
*Attorney, Agent, or Firm*—Blakely, Sokoloff, Taylor & Zafman

[57] ABSTRACT

A process for determining a quiescent power supply current ($I_{DDQ}$) of a device under test (DUT) at a first node. The process includes the steps of providing a reference current to the first node and decoupling a power supply from the first node. A first node voltage is determined at a first time after the power supply is decoupled from the first node. The first node voltage is determined at a second time after the first time. If the first node voltage increases from the first time to the second time, it is indicated that the $I_{DDQ}$ of the DUT is less than the reference current. If the first node voltage decreases from the first time to the second time, it is indicated that the $I_{DDQ}$ of the DUT is greater than the reference current.

19 Claims, 13 Drawing Sheets

OTHER PUBLICATIONS

E. Vandris & G. Sobelman, *A Mixed Functional/Iddq Testing Methodology For CMOS Transistor Faults*, IEEE, 1991 Int'l Test Conference, pp. 608–614.

C. Chen & J. Abrahm, *High Quality Tests For Switch–Level Circuits Using Current And Logic Test Generation Algorithms*, IEEE, 1991 Int'l Test Conference, pp. 615–622.

R. Aitken, *Fault Location With Current Monitoring*, IEEE, 1991 Int'l Test Conference, pp. 623–632.

R. Kapur, J. Park & M. Mercer, *All Tests For A Fault Are Not Equally Valuable For Defect Detection*, IEEE, 1992 Int'l Test Conference, pp. 762–769.

R. Gulati, W. Mao & D. Goel, *Detection Of "Undetectable" Faults Using Iddq Testing*, IEEE, 1992 Int'l Test Conference, pp. 770–775.

R. Aitken, *A Comparison Of Defect Models For Fault Location With Iddq Measurements*, IEEE, 1992 Int'l Test Conference, pp. 778–787.

Y. Miura & K. Kinoshita, *Circuit Design For Built–In Current Testing*, IEEE, 1992 Int'l Test Conference, pp. 873–881.

R. Rodriguez–Montanes, E. M. J. G. Bruls & J. Figueras, *Bridging Defects Resistance Measurements In A CMOS Process*, IEEE, 1992 Int'l Test Conference, pp. 892–899.

5,694,063

HIGH SPEED $I_{DDQ}$ MONITOR CIRCUIT

This is a continuation of application Ser. No. 08/572,352, filed Dec. 14, 1995, now abandoned which is a continuation of application Ser. No. 08/288,917, filed Aug. 11, 1994, now abandoned.

FIELD OF THE INVENTION

The present invention relates to detection of defects in metal oxide semiconductor (MOS) circuits and more particularly to the detection of defects in complementary metal oxide semiconductor (CMOS) circuits by measuring the quiescent power supply current $I_{DDQ}$ of the device under test (DUT).

BACKGROUND OF THE INVENTION

Very large scale integrated (VLSI) circuits are tested using automatic test equipment ("ATE") that typically test whether the VLSI circuit or device under test ("DUT") is fully functional according to a "stuck-at fault" testing model. Such functional testing requires the application of a set of input "test vectors" to the DUT to determine if the DUT provides the expected output for each test vector. Each test vector is a combination of input signals that causes the logic of the DUT to change states. Whether the logic of the DUT changes states can be determined by monitoring the outputs of the DUT.

Wherein functional testing is adequate for detecting many types of device defects, there are several types of defects that functional testing may not detect effectively. These defects include (1) gate oxide shorts, (2) bridging defects, (3) punchthrough, (4) parasitic transistor leakage, (5) leaky p-n junctions, (6) open drain or source defects, (7) open gate defects, and (8) transmission gate opens. Devices having such defects may pass standard functional testing, but they will ultimately have a shorter life span than devices without such defects.

For CMOS circuits, it has been discovered that testing the quiescent power supply current $I_{DDQ}$ of the DUT may increase the rate of detection for the above-mentioned defects. It has also been discovered that testing the $I_{DDQ}$ of the DUT is useful for the detection of design and fabrication errors. The quiescent power supply current $I_{DDQ}$ of a CMOS DUT is theoretically equal to zero when the logic of the DUT is in any known state.

FIG. 1A shows a DUT 100 configured for testing by an ATE (not shown). The DUT 100 includes a plurality of input conductors to which the ATE is coupled for providing input test vectors to the DUT 100. The DUT 100 also includes a plurality of output conductors which are coupled to the ATE for providing output signals to the ATE in response to the input signals provided by the ATE. Thus, the ATE can determine whether the logic of DUT 100 correctly changes states.

The DUT 100 may be, for example, a CMOS VLSI circuit comprising many thousands of CMOS inverters, the fundamental building block of CMOS circuits. One such CMOS inverter is shown as including an NMOS field effect transistor ("FET") Q1 and a PMOS FET Q2. The gates of FET Q1 and FET Q2 are coupled together for receiving the same input signal. The input signal may be provided directly by an input conductor of the DUT 100 or by the output of another CMOS inverter. The drain of FET Q2 is coupled to receive a power supply voltage $V_{DD}$ from a power supply, and the source of the FET Q2 is coupled to the drain of FET Q1. The source of FET Q1 is coupled to system ground, VSS. The output of the CMOS inverter is taken from the node shared by the source of FET Q2 an the drain of FET Q1.

The quiescent power supply current $I_{DDQ}$ of a CMOS inverter is ideally equal to zero because, theoretically, only one of the FETs Q1 and Q2 is switched on at any given time. Thus, no conduction path is provided between the power supply and ground. If the input signal is a logic low, FET Q2 is switched on and FET Q1 is switched off, which causes the output of the CMOS inverter to be tied to $V_{DD}$, pulling the output up to a logic high level. Conversely, if the input signal is logic high, FET Q1 is switched on and FET Q2 is switched off, which causes the output of the CMOS inverter to be tied to VSS, pulling the output down to a logic low level. This behavior is shown in FIG. 1B. Curve 105 shows the input signal VIN, and curve 110 shows the output signal VOUT.

Practically speaking, however, the quiescent power supply current $I_{DDQ}$ of a typical CMOS inverter is some nominal, non-zero value. This is because neither of the FETs Q1 and Q2 are typically ever switched completely off, and a small conduction path is provided. A typical $I_{DDQ}$ value for a non-defective CMOS is less than 20 nA.

Defective CMOS VLSI circuits can exhibit elevated $I_{DDQ}$ levels in response to the appropriate test vectors. The defects listed above typically lead to conduction paths and therefore result in an elevation of the quiescent power supply current $I_{DDQ}$ that is greater than the $I_{DDQ}$ of a non-defective CMOS device. Thus, monitoring the $I_{DDQ}$ of a CMOS VLSI circuit can result in the detection of defects that are unlikely to be detected using standard functional testing.

FIG. 1C shows the behavior of the power supply current $I_{DD}$ over time. Before time t0, the CMOS inverter is in a known state, and the quiescent power supply current $I_{DDQ}$ is nominal value, as shown by arrow 115. At time t0, the CMOS inverter changes states, resulting in a current transient shown by arrow 120. This current transient is expected as both of the FETs Q1 and Q2 are conducting when switching between states. If the CMOS inverter is not defective, the power supply current $I_{DD}$ eventually settles to the nominal $I_{DDQ}$. This is shown by arrow 125. If the CMOS inverter is defective, the $I_{DDQ}$ of the device is greater than the nominal value, as shown by arrow 130.

FIG. 2 shows a prior circuit for measuring the quiescent power supply current of a device under test. The circuit 200 is coupled between a power supply 205 of the ATE and the DUT 100. The DUT 100 is shown as including logic 225 coupled in parallel with the inherent capacitance of the DUT 100. The logic 225 includes at least one CMOS inverter as described above.

The circuit 200 includes a switch 210 coupled between the power supply 205 and the DUT, capacitors C1 and C2, and buffer 220. During normal functional testing, the switch 210 is closed, providing a low impedance path between the power supply 205 and the DUT 100. This low impedance path allows the high transient currents that occur when the DUT changes states and provides the power supply voltage $V_{DD}$ to the DUT 100. The switch 210 is shown as a FET having its gate controlled by a control signal of the ATE.

The circuit 200 measures the amount of quiescent power supply current $I_{DDQ}$ for the DUT 100 when the switch 210 is opened. To measure the quiescent power supply current $I_{DDQ}$, the circuit 200 measures the time rate of change for the voltage at node 215. The input to the buffer 220 provides a high input impedance value such that the only conduction path from the node 215 to system ground VSS is through the DUT 100. The output of the buffer 220, which is equal to the value $V_{DUT}$ at node 215, is supplied to measurement circuitry in the ATE (not shown).

The circuit operates according to the well-known relationship between current, capacitance, and the time rate of change for voltage, namely:

$$I_{DDQ} = C_{total}\left(\frac{dV}{dt}\right). \quad (1)$$

To measure the quiescent power supply current $I_{DDQ}$, the state of the logic 225 is changed in response to an input test vector, giving rise to transient $I_{DD}$ current. The transient is allowed to subside, and the switch 210 is opened, decoupling the power supply 205 and the capacitor C1 from the node 215. While the switch was closed, the parallel capacitors of C2 and $C_{DUT}$ were charged the power supply voltage $V_{DD}$. When the switch is opened, the parallel capacitors C2 and $C_{DUT}$ begin to discharge to ground via the DUT 100, giving rise to a current. The amount of current that is conducted via the DUT 100 can be determined using equation 1. To accurately calculate $I_{DDQ}$, $C_{total}$, which is the parallel capacitance of the capacitors C2 and $C_{DUT}$, $C_{DUT}$ must be known. The requirement that $C_{DUT}$ must be known is one disadvantage of this prior art $I_{DDQ}$ measurement technique.

When the switch 210 is opened, the measurement circuitry of the ATE samples and holds the voltage at the output of the buffer 220. After a fixed amount of time equal to $\Delta t$, the voltage at the output of the buffer 220 is sampled again. The difference between the two sampled voltages is determined to yield the change in voltage, $\Delta V$. If the capacitance $C_{total}$ is known, the quiescent current $I_{DDQ}$ can be determined using the values $\Delta t$, $\Delta V$, and equation (1), above. The measured $I_{DDQ}$ value is then compared to an expected $I_{DDQ}$ value by the ATE, and the result of the comparison indicates whether the DUT passes or fails the $I_{DDQ}$ measurement test.

FIG. 3 shows the operating characteristics for the circuit of FIG. 2. Prior to time t0, the ATE conducts functional testing of the DUT 100, changing the state of the DUT several times. Curve 305 shows power supply current as a function of time, and curve 310 shows the node voltage $V_{DUT}$ of node 215 as a function of time. Each current transient is shown as producing a corresponding decrease in the node voltage $V_{DUT}$. At time t0, the switch 210 is opened, and the voltage at the output of the buffer 220 is sampled. At time t1, the voltage at the output of the buffer 220 is again sampled. As shown, the node voltage $V_{DUT}$ decreases over time for both passing and failing devices. The voltage drop for a failing device, however, is much greater than that for a passing device. The precise value of $I_{DDQ}$ is determined using equation (1), above.

The cycle time for measuring $I_{DDQ}$ using the circuit 200 is much greater than the cycle time for standard functional testing. The capacitors must be allowed sufficient time to discharge, and the measurement circuitry of the ATE must be allowed sufficient time to detect changes in voltage. Therefore, much of the increase in cycle time is required by the testing mechanism. A significant portion of the increase in cycle time, however, is required by the measurement technique, which requires the quantification of the change in voltage, $\Delta V$.

SUMMARY AND OBJECTS OF THE INVENTION

One object of the present invention is to provide a method for quickly determining the quiescent power supply current of a device under test.

Another object of the invention is to provide a circuit for quickly determining the quiescent power supply current of a device under test.

Another object of the invention is to provide a method for determining the value of the quiescent power supply current of a device under test by detecting the slope of the time rate of change in voltage for a node.

These and other objects of the invention are provided by a process for determining a quiescent power supply current ($I_{DDQ}$) of a device under test (DUT) at a first node. The process includes the steps of providing a reference current to the first node and decoupling a power supply from the first node. A first node voltage is determined at a first time after the power supply is decoupled from the first node. The first node voltage is determined at a second time after the first time. If the first node voltage increases from the first time to the second time, it is indicated that the $I_{DDQ}$ of the DUT is less than the reference current. If the first node voltage decreases from the first time to the second time, it is indicated that the $I_{DDQ}$ of the DUT is greater than the reference current.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1A:
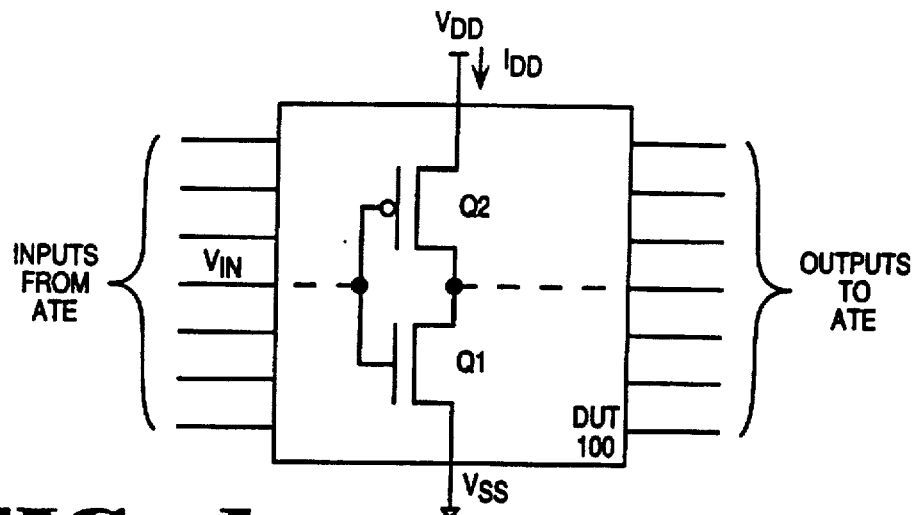
FIG. 1A shows a device under test.
Figure 1B:
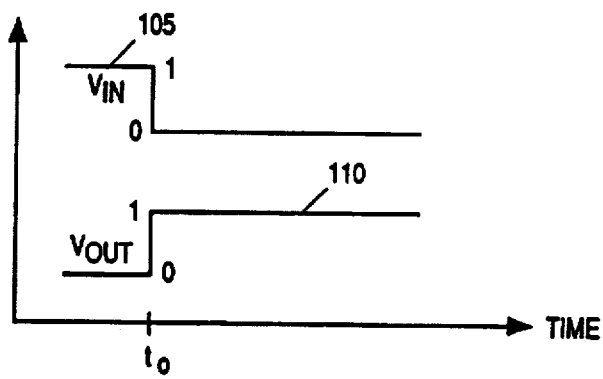
FIG. 1B shows the input and output characteristics of a CMOS inverter.
Figure 1C:
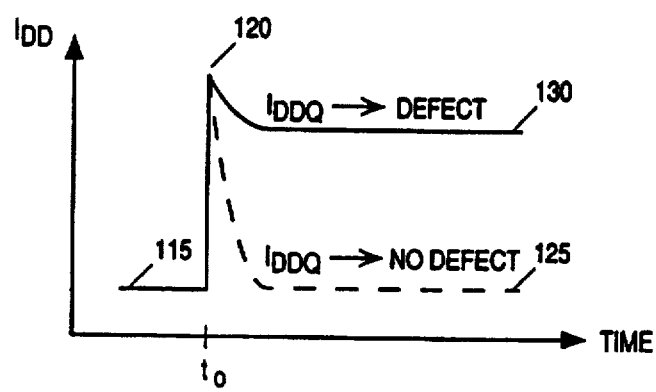
FIG. 1C shows quiescent power supply current $I_{DDQ}$ for a CMOS device under test.
Figure 2:
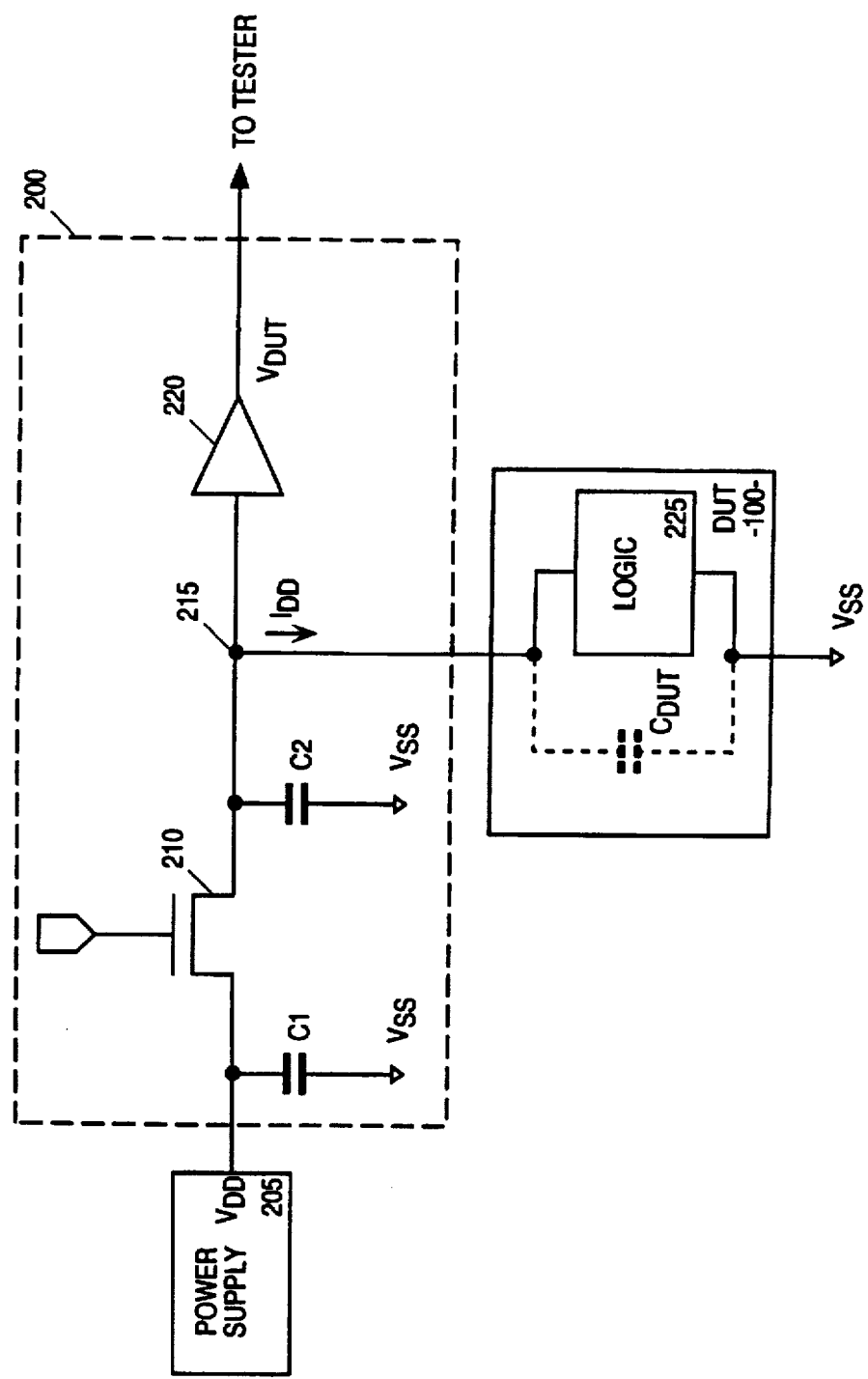
FIG. 2 shows a circuit for measuring the quiescent power supply current $I_{DDQ}$ according to a prior art method.
Figure 3:
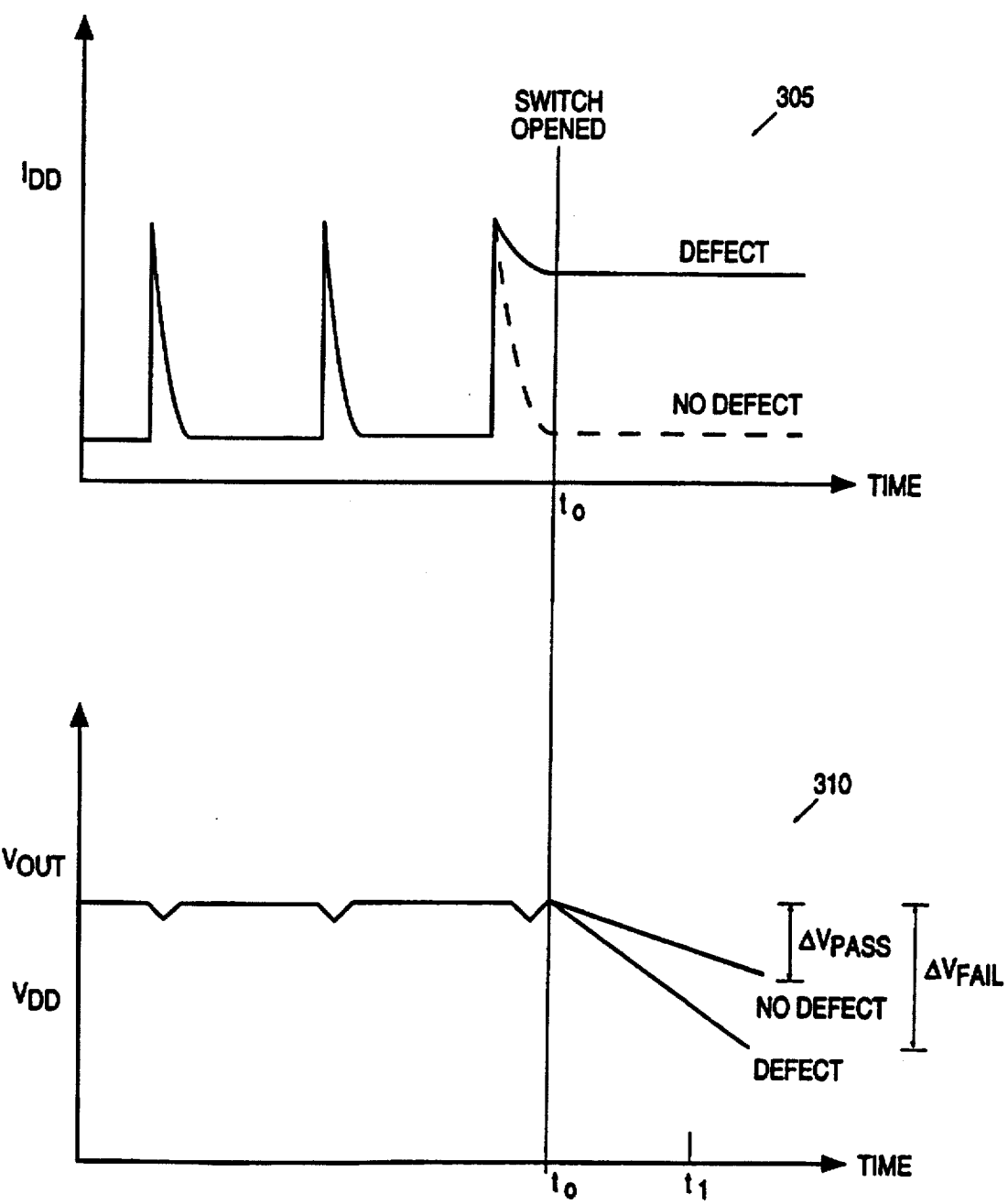
FIG. 3 shows the operating characteristics of the prior art circuit for measuring the quiescent power supply current $I_{DDQ}$.
Figure 4:
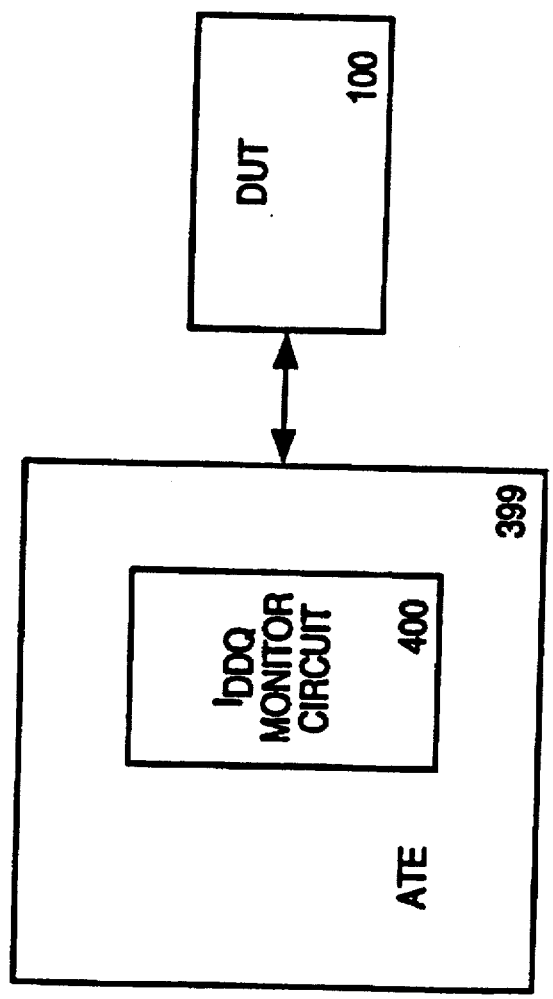
FIG. 4 shows automatic test equipment including an improved $I_{DDQ}$ monitor circuit.

FIG. 4 shows automatic test equipment ("ATE") 399 that includes an improved $I_{DDQ}$ monitor circuit 400 for testing the quiescent power supply current $I_{DDQ}$ of the DUT 100. ATE 399 is coupled to the DUT 100 for performing both functional testing and $I_{DDQ}$ testing of the DUT 100. The number of functional and $I_{DDQ}$ test vectors applied to the DUT 100 is programmable and depends on the complexity and architecture of the DUT 100.

Figure 5:
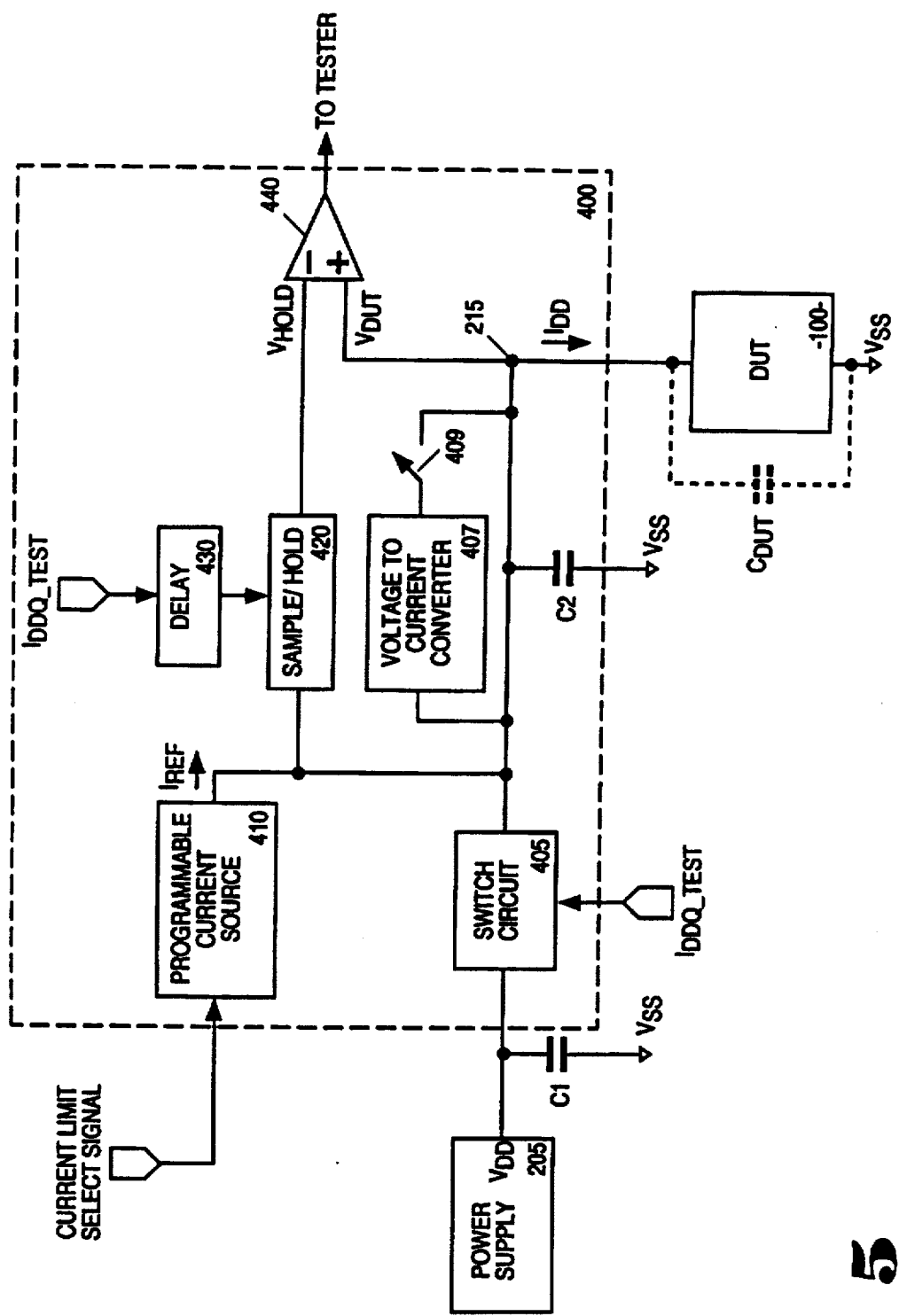
FIG. 5 shows the improved $I_{DDQ}$ monitor circuit.

FIG. 5 shows the improved $I_{DDQ}$ monitor circuit for determining the quiescent power supply current $I_{DDQ}$ of a device under test. Unlike certain prior $I_{DDQ}$ measuring circuits, the $I_{DDQ}$ monitor circuit 400 does not measure the change in voltage at the node 215. Instead, the $I_{DDQ}$ monitor circuit 400 detects whether the voltage at the node 215 increases or decreases over time. By detecting the slope polarity of the time rate of change, the quiescent power supply current $I_{DDQ}$ can be quickly determined in a qualitative manner. This helps to increase the speed of $I_{DDQ}$ testing by obviating the need for quantitative analysis of the voltage at node 215.

The $I_{DDQ}$ monitor circuit 400 includes a switch circuit 405, decoupling capacitor C2, a programmable current source 410, a voltage-to-current converter 407, a switch 409, a sample and hold circuit 420, a delay circuit 430, and a differential comparator 440. The switch circuit 405 acts similarly to the switch 210 of the prior circuit but is designed to reduce charge injection that occurs when the power supply 205 is decoupled from the node 215. The voltage-to-current converter 407 is also provided for further reducing the effects of charge injection due to switching. The switch circuit 405 and the voltage-to-current converter 407 are described in greater detail below.

The programmable current source 410 is coupled to the node 215 for providing a reference current $I_{REF}$ to the node 215. The value of the reference current $I_{REF}$ is selectable by the user over a range of values. For the present embodiment, the reference current is programmable from 0.0 to 1.023 milliamperes by 250 nanoampere steps. The accuracy of the programmable current source 410 is ±700 nanoamperes.

When the switch circuit 405 is switched off such that the power supply 205 is decoupled from node 215, the reference current $I_{REF}$ flows into the node 215 from the programmable current source, and a current flows out of the node 215 to ground via the DUT 100. The current flowing out of node 215 is equal to the quiescent power supply current $I_{DDQ}$ for the DUT 100. If the reference current $I_{REF}$ is greater than the quiescent power supply current $I_{DDQ}$ for the DUT 100, the excess charge supplied to the node 215 by the programmable current source 410 is stored in the decoupling capacitor C2 and the parasitic DUT capacitance, which is shown as capacitor $C_{DUT}$, such that the voltage at node 215 increases over time. If the quiescent power supply current $I_{DDQ}$ for the DUT 100 is greater than the reference current $I_{REF}$, the decoupling capacitor C2 and the parasitic DUT capacitor $C_{DUT}$ discharge towards ground such that the voltage at node 215 decreases over time.

Thus, if the conduction path from the node 215 to ground provided by the DUT 100 sinks more current than is provided by the programmable current source 410, the additional current is provided by the capacitors, and the node voltage drops. Conversely, if the conduction path provided by the DUT 100 sinks less current than is provided by the programmable current source 410, the excess charge is stored in capacitors, and the node voltage increases. If the reference current $I_{REF}$ is selected to be a value equal to the $I_{DDQ}$ value for a failing DUT, the value for $I_{DDQ}$ does not need to be quantitatively determined. It is sufficient to monitor whether the voltage at the node 215 increases or decreases.

To accommodate the existence of inaccuracies in $I_{DDQ}$ monitor circuit 400, the value of the reference current $I_{REF}$ is selected to be equal to the $I_{DDQ}$ value for a failing DUT minus a guardband value, $I_r$. The amount of guardband provided in the reference current $I_{REF}$ determines the resolution of the $I_{DDQ}$ monitor circuit and, ultimately, the $I_{DDQ}$ test cycle time. This is discussed in more detail below.

The sample and hold circuit 420 and the comparator 440 are provided for detecting whether the node voltage of node 215 increases or decreases. The switch circuit 405 decouples the power supply 205 in response to an active $I_{DDQ}$_TEST signal. The active $I_{DDQ}$_TEST signal is also provided after a time delay to the sample and hold circuit 420. The delay circuit 430 provides the time delay, which is of sufficient length to allow switching transients to settle. When the sample and hold circuit 420 receives the active $I_{DDQ}$_TEST signal, the sample and hold circuit 420 samples the node voltage $V_{DUT}$ at node 215 and holds the voltage as a reference voltage $V_{REF}$. The reference voltage $V_{REF}$ is supplied by the sample and hold circuit 420 to the negative terminal of the comparator 440. The node voltage $V_{DUT}$ is coupled to the positive terminal of the comparator 440.

Once the reference voltage $V_{REF}$ is sampled and held, a period of time is provided to allow the comparator 440 sufficient time to detect a change in the voltage at node 215. The time allowed is determined by the desired resolution of the $I_{DDQ}$ monitor circuit 400 and the size of the decoupling capacitor C2, which is typically very much larger than the parasitic capacitance of the DUT 100. Therefore, the capacitance of the DUT does not need to be known to provide an accurate determination of the quiescent power supply current $I_{DDQ}$ of the DUT 100. The comparator 440 outputs a Boolean logic signal when it determines the polarity of the time rate of change of the node voltage $V_{DUT}$.

Figure 6:
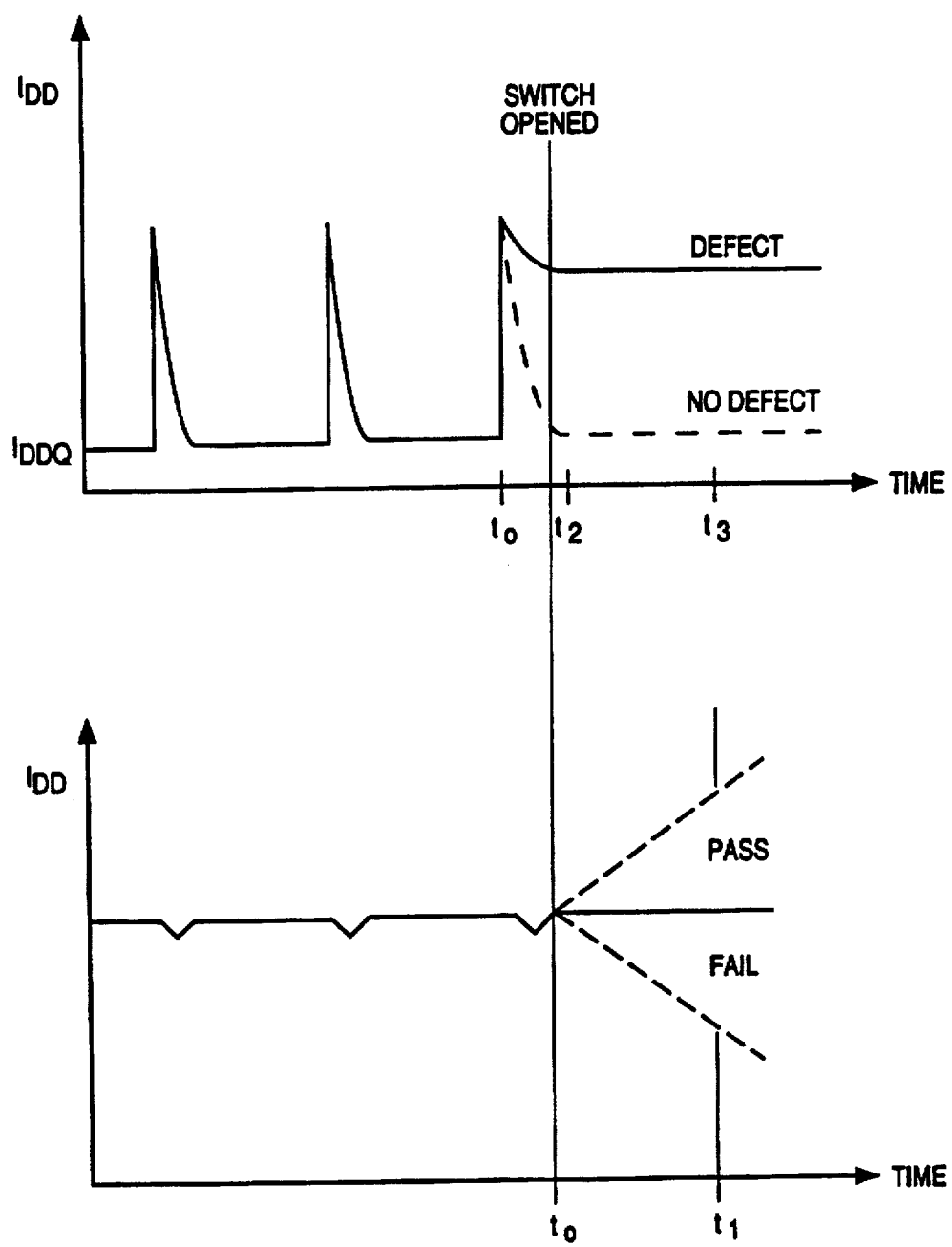
FIG. 6 shows the operating characteristics of the improved $I_{DDQ}$ monitor circuit.

The operation of the $I_{DDQ}$ monitoring circuit 400 may be understood with reference to FIG. 6. Prior to time t0, standard functional testing is performed, and the logic of DUT 100 is toggled between states in response to the various input test vectors. At time t0, an $I_{DDQ}$ test vector is input to the DUT 100, causing a current transient. At time t1, after the current transient is allowed to subside, the active $I_{DDQ}$_TEST signal is provided to the switch circuit 405, causing the switch circuit 405 to decouple the power supply 205 from the node 215. After the switching transients are allowed to subside, the node voltage at node 215 is sampled and held as the reference voltage $V_{REF}$ at time t2. At the end of the $I_{DDQ}$ test cycle, which is shown as time t3, the output of the comparator 440 is checked to determine if the DUT 100 has passed the $I_{DDQ}$ test vector. A passing part has a voltage $V_{DUT}$ that increases over time, wherein a failing part has a voltage that decreases over time. The length of the $I_{DDQ}$ test cycle, $T_c$, which begins at time t0 and ends at time t3, is determined by the following equation:

$$T_c = V_{offset} \times \left( \frac{C2}{I_r} \right) + T_S, \qquad (2)$$

wherein $V_{offset}$ is the offset voltage for the comparator 440, $I_r$ is the guardband and the desired resolution for the $I_{DDQ}$ test, and $T_s$ is a fixed overhead time required by the on/off transition time of the switch circuit 405. For this embodiment, the offset voltage $V_{offset}$ for the comparator 440 is ±3 millivolts and the transition time $T_s$ for the switch circuit 405 is equal to one microsecond. The resolution $I_r$ of the $I_{DDQ}$ test can be selected by the user of the ATE. Thus, the cycle time $T_c$ of the $I_{DDQ}$ test ultimately depends on the selected resolution $I_r$.

For example, if the capacitance of decoupling capacitor C2 is equal to 0.01 microfarads, the resolution $I_r$ is 10 microamps, and the values of $V_{offset}$ and $T_s$ are those described above, the $I_{DDQ}$ test cycle time $T_c$ is equal to four microseconds. If the resolution $I_r$ is changed to 20 microamps, the test cycle time $T_c$ is reduced to 2.5 microseconds.

Figure 7:
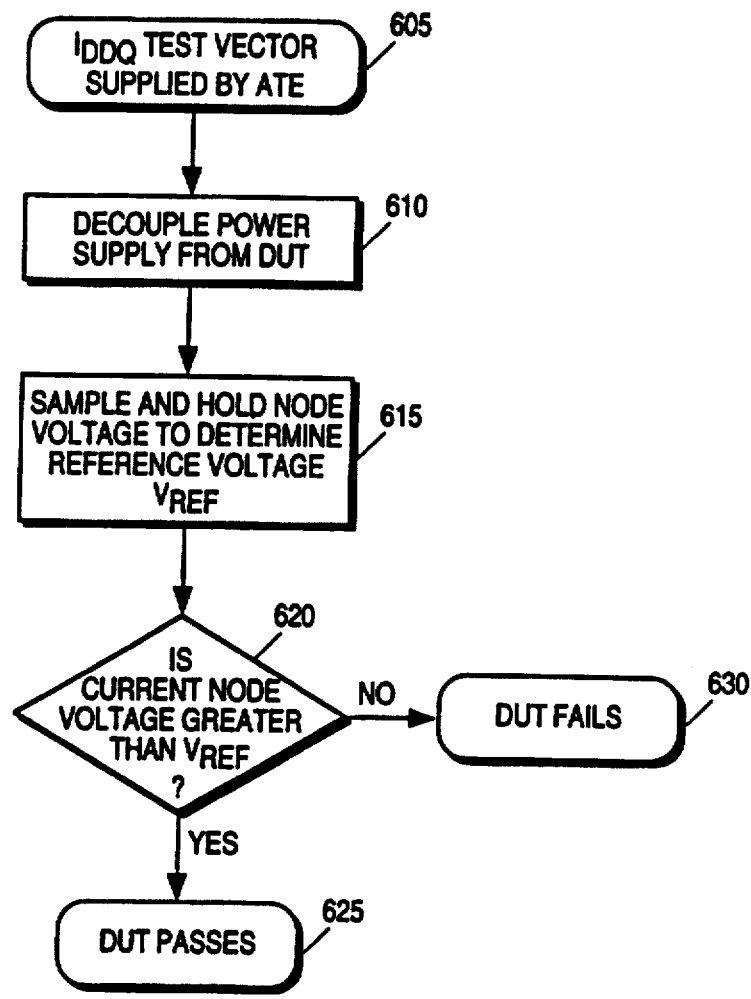
FIG. 7 shows a method used by the improved $I_{DDQ}$ monitor circuit.

FIG. 7 is a flow chart showing a method implemented by the $I_{DDQ}$ monitor circuit of the present embodiment. At step 605, an $I_{DDQ}$ test vector is supplied to the inputs of the DUT 100 by the ATE. At step 610, the switch circuit 405 decouples the power supply 205 from the node 215 in response to an active $I_{DDQ}$ TEST signal received from the ATE. At step 615, the sample and hold circuit 420 samples the node voltage $V_{DUT}$ at the node 215 and holds the node voltage as the reference voltage $V_{REF}$ in response to receiving a delayed version of the active $I_{DDQ}$ TEST signal. At step 620, the node voltage $V_{DUT}$ is compared to the reference voltage $V_{REF}$. If the node voltage $V_{DUT}$ is greater than the reference voltage $V_{REF}$, the comparator 440 indicates that the DUT passes the $I_{DDQ}$ test at step 625. If the node voltage $V_{DUT}$ is less than the reference voltage $V_{REF}$, the comparator 440 indicates that the DUT fails the $I_{DDQ}$ test at step 630.

Figure 8:
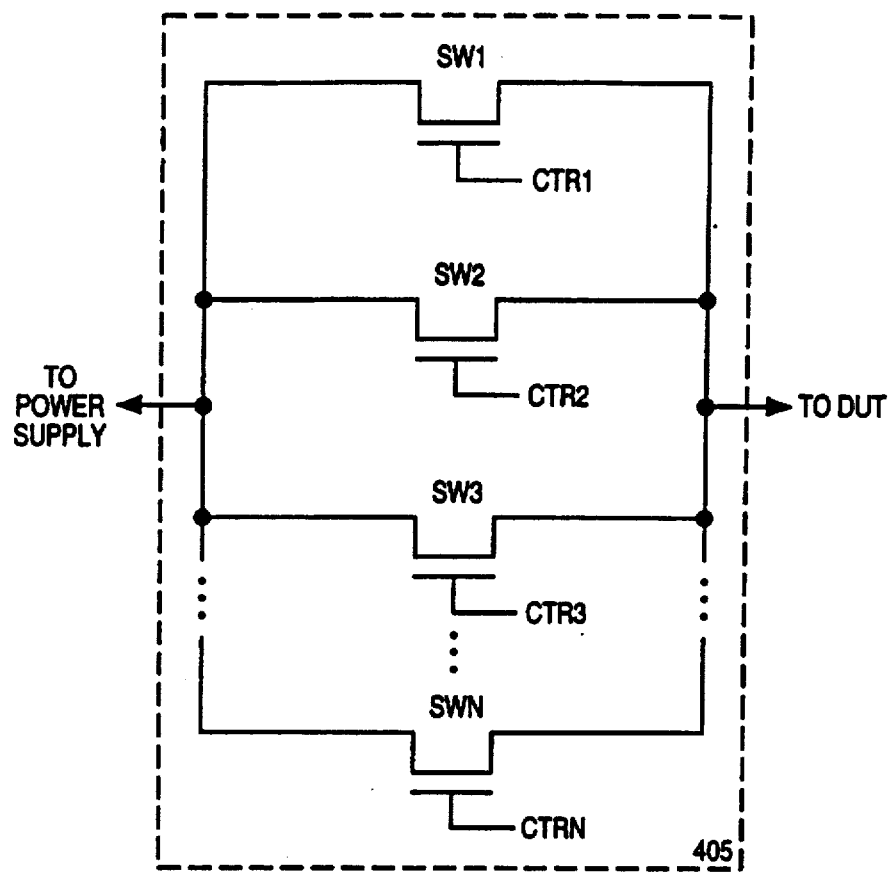
FIG. 8 shows a switch circuit of the improved $I_{DDQ}$ monitor circuit.

FIG. 8 shows the switch circuit 405 in greater detail. The switch circuit 405 operates as a low impedance switch having reduced charge injection. Charge injection is a common problem for FET switches that have a low impedance or "on resistance," $R_{on}$, when switched on. When a low impedance FET switch is switched off, a parasitic capacitance between the gate and the source of a FET switch causes the signal at the gate to be coupled to the source when the FET switch is switched off, thereby injecting noise at the source of the FET switch. The charge injection can be quite significant and can result in the changing of the DUT voltage, which can cause the logic state of the DUT to change.

To reduce the effects of charge injection and shorten the $I_{DDQ}$ test cycle, the structure as shown in FIG. 8 is used. A multiplicity of FET switches, each having a unique "on resistance," $R_{on}$, are coupled in parallel between the power supply 205 and the DUT 100. The switch SW1 has the lowest "on resistance" value of R1. The FET switch SW2 has the next lowest "on resistance" value of R2, and the FET switches from SW3 to SWN have successively greater "on resistance" values, from R3 to RN.

Each of the FET switches SW1 to SWN is controlled independently of the other FET switches by supplying unique control signals to the gates of each of the FET switches. The control signals may be supplied externally by the ATE, or they may be generated internally by logic or a state machine in response to the $I_{DDQ}$ TEST signal. To decouple the power supply 205 from the node 215, each of the switches is switched off, one at a time, according to its "on resistance" value. The switch having the lowest resistance is turned off first, and each succeeding switch that is turned off has a successively greater "on resistance." For example, in the switch circuit 405 of FIG. 7, switch SW1 is turned off first, switch SW2 is turned off second, switch SW3 is turned off third, switch SW3+1 is turned off next and so on until, finally, switch SWN is turned off. To couple the power supply 205 to the node 215, the process is reversed. Namely, the switch having the highest on resistance is closed first, and the remaining switches are closed in order of decreasing "on resistance" values. The switches may be any type of switch or combination of types of switches, including MOSFET, JFET, and BJT switches. The type of switch used is determined by the test requirements of the $I_{DDQ}$ monitor circuit 400.

Figure 9A:
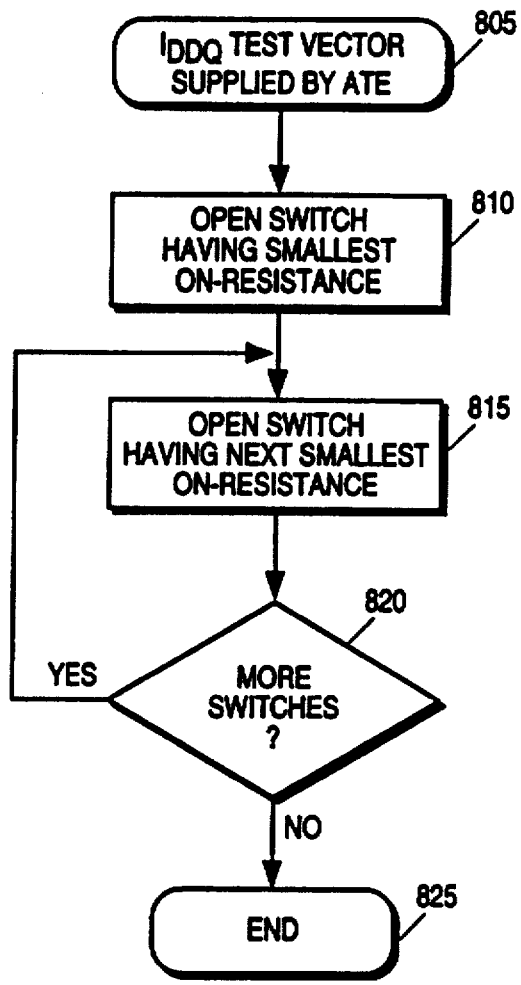
FIG. 9A is a flow chart showing a method used to open the switch circuit such that charge injection is reduced.

FIG. 9A is a flow chart showing a method used by the switch circuit 405 to decouple the power supply 205 from the node 215. This method and equivalent methods may be implemented using logic, a state machine, or similar control circuit located externally to the IDDQ monitor circuit 400, within the $I_{DDQ}$ monitor circuit 400, or within the switch circuit 405. At step 805, the ATE begins the $I_{DDQ}$ test cycle by supplying an $I_{DDQ}$ test vector to the DUT 100. At step 810, a first control signal is received by the lowest impedance switch of the switch circuit 405, and that switch is switched off. At step 815, the switch having the next lowest impedance switch is switched off in response to its control signal. At step 820, it is determined whether there are any switches remaining in the switch circuit 405. If no switches remain to be switched on, the decoupling process ends at step 825. If there are more switches to be switched on, steps 815 and 820 are repeated until no switches remain. In this manner, the charge injection of the switch circuit 405 is reduced.

Figure 9B:
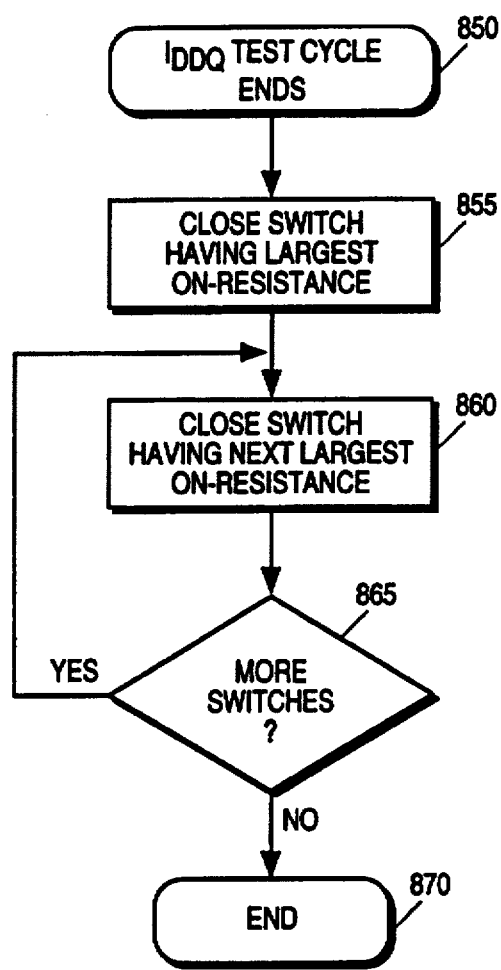
FIG. 9B is a flow chart showing a method used to close the switch circuit such that charge injection is reduced.

FIG. 9B is a flow chart showing a method used by the switch circuit 405 to couple the power supply 205 to the node 215 at the end of the $I_{DDQ}$ test cycle. At step 850, the $I_{DDQ}$ test cycle ends. At step 855, the highest impedance switch is switched on first in response to its own control signal. At step 860, the next highest impedance switch is switched on in response to its control signal. At step 865, it is determined whether any switches remain to be turned on. If no switches remain to be switched on, the coupling process ends at step 870. If there are more switches to be switched on, steps 865 and 870 are repeated until no switches remain.

Figure 10:
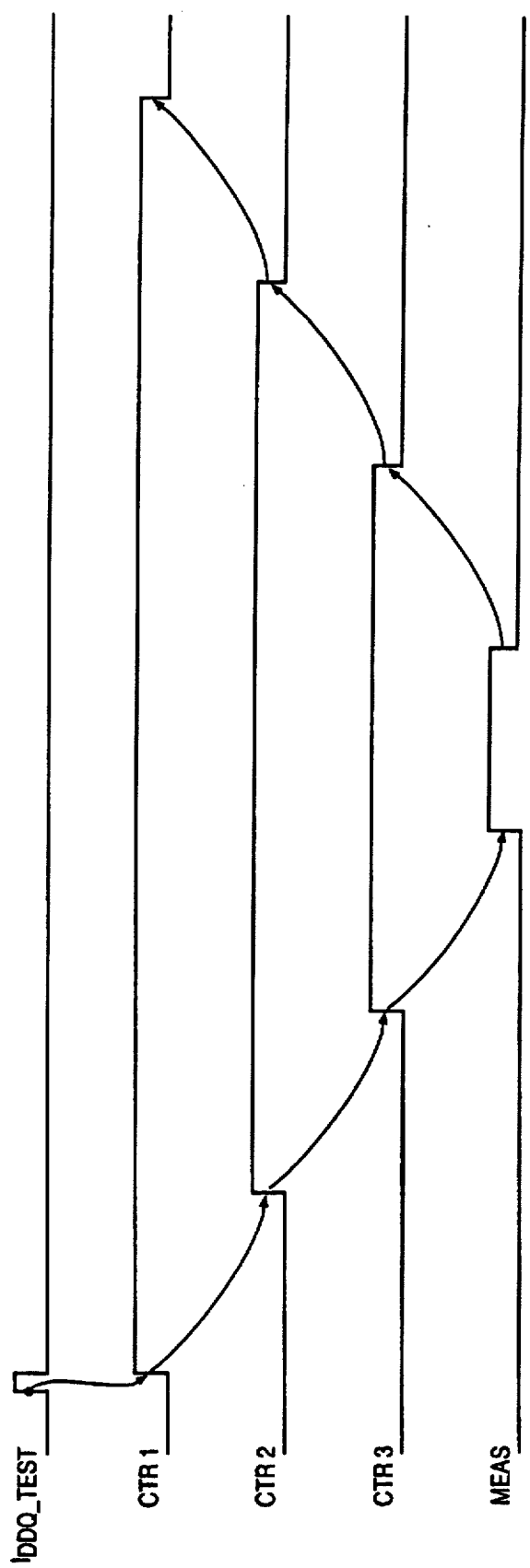
FIG. 10 is a timing diagram showing the operation of a switch circuit having three switches.

FIG. 10 is a timing diagram of the operation of a switch circuit 405 having three switches SW1–SW3. The ATE 399 begins an $I_{DDQ}$ test cycle by delivering a logic high IDDQ__TEST pulse to the $I_{DDQ}$ monitor circuit 400. As the IDDQ__TEST pulse goes logic low, the control signal CTR1 goes high, switching off switch SW1. A predetermined interval after switch SW1 is switched off, control signal CTR2 goes high, switching off switch SW2. The predetermined interval is calculated in light of the RC time constant of the node 215. The inclusion of the predetermined interval allows for the compensation of the charge injection of switching off a single switch. Because other switches remain on during the predetermined interval, current from the power supply flows through node 215, charging the node to the appropriate voltage to better ensure continued operation of the logic of the DUT 100. For the present embodiment, the duration of the predetermined interval is 2 μS, but the interval may be changed as needed.

After the predetermined interval, control signal CTR3 goes to a logic high level, and switch SW3 is switched off. Another predetermined interval is provided between the time the control signal CTR3 goes high and the control signal MEAS high. During this predetermined interval, the switching transients are allowed to settle. The control signal MEAS is generated by the delay circuit and supplied to the sample and hold circuit in response to the $I_{DDQ}$ TEST control signal. The time that MEAS remains high is equal to the test cycle time $T_c$ minus the fixed overhead time $T_r$. For the present embodiment, $T_r$ is 12 μs and MEAS is asserted high for fifty times the IDDQ__TEST pulse width. The sample and hold circuit 420 samples the node voltage VDUT when MEAS goes high, and the output of the comparator 440 may be read by ATE 399 when MEAS goes low. To switch the switch circuit 405 on, the control signals CTR3, CTR2 and CTR1 are asserted logic low in order. Again the predetermined intervals are provided between each event.

Figure 11:
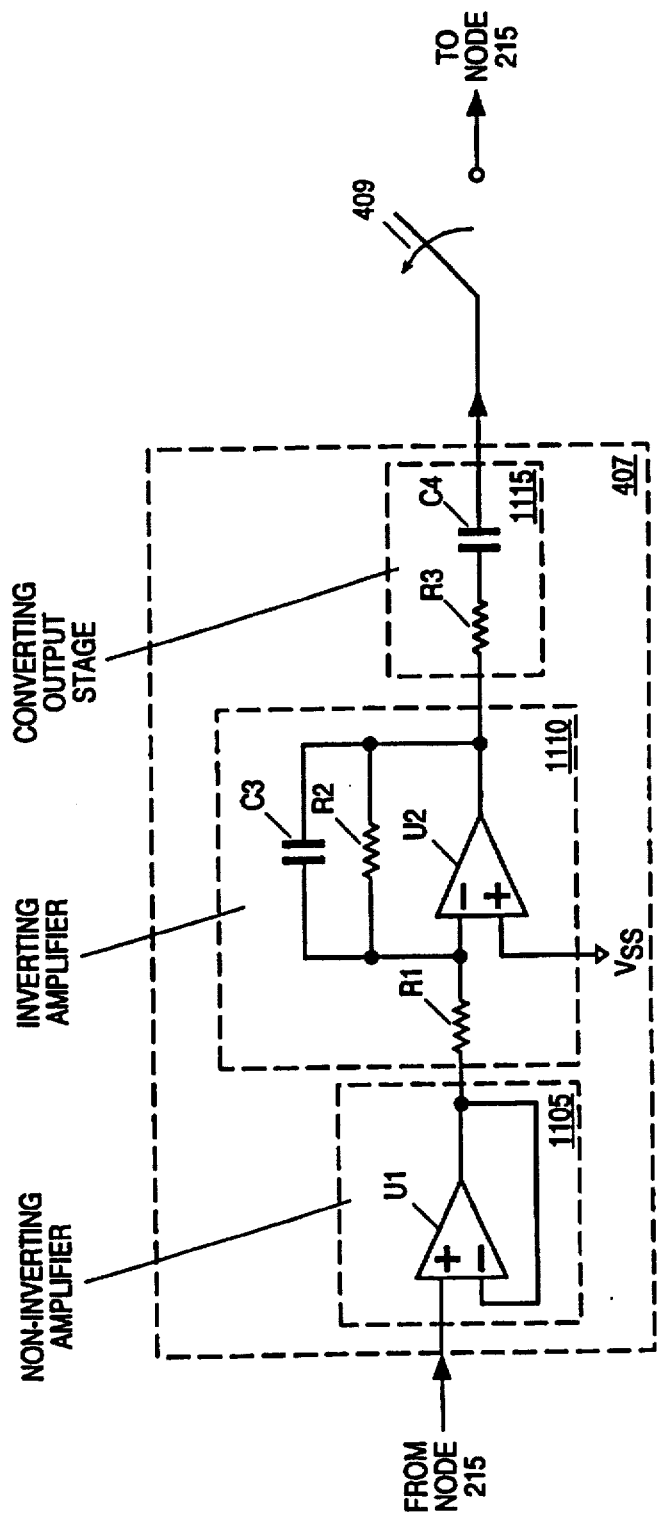
FIG. 11 shows a voltage-to-current converter of the improved $I_{DDQ}$ monitor circuit.

FIG. 11 shows the voltage to current converter in greater detail. The voltage-to-current converter 407 also reduces the effects of charge injection due to switching, thus further reducing the $I_{DDQ}$ test cycle time. The voltage to current converter 407 is a feedback circuit that detects the voltage transient at the node 215 caused by charge injection and injects a compensation current into the node 215 to compensate for the detected charge injection. The voltage-to-current converter 407 operates between the times that the switch circuit 405 is switched off and the node voltage $V_{DUT}$ is first sampled. The switch 409 disconnects the voltage to current converter from the node 215 before the node voltage $V_{DUT}$ is first sampled.

The voltage-to-current converter 407 is comprised generally of a non-inverting amplifier 1105, an inverting amplifier 1110, and a converting output stage 1115. The non-inverting amplifier 1105 has a high input impedance and acts primarily as a buffer between the node 215 and the inverting amplifier 1110. For the present embodiment, the non-inverting amplifier has unity gain. The inverting amplifier 1110 has its input coupled to the output of the non-inverting amplifier 1105. The inverting amplifier 1110 inverts the voltage output by the non-inverting amplifier. For the present embodiment, the inverting amplifier 1110 also has unity gain; however, the gain of the inverting amplifier 1110 may be increased so long as the feedback loop is stabilized. Unity gain simplifies stabilization of the feedback loop. The converting output stage 1115 is coupled to the output of the inverting amplifier 1110. The converting output stage 1115 converts the voltage output by the inverting amplifier 1110 to a compensation current that is supplied to the node 215.

As shown, the non-inverting amplifier 1105 may include an operational amplifier U1 coupled as non-inverting amplifier having its positive input coupled to the node 215 and its negative input coupled to its output. The inverting amplifier 1110 may include an operational amplifier U2 coupled as an inverting AC amplifier having unity gain, wherein a resistor R1 is coupled between the negative input of the operational amplifier U2 and the output of the non-inverting amplifier 11105. Compensation capacitor C3 and the resistor R2 are coupled in parallel between the negative input of operational amplifier U2 and the output of operational amplifier U2. The compensation capacitor C3 provides loop stability by compensating for phase shifts between the input of the voltage-to-current converter 407, which is coupled to node 215, and the output of the second pole of the switch 409, which is also coupled to node 215. The converting output stage 1115 may include resistor R3 and capacitor C4. The operational amplifier U2 outputs a voltage which is converted by the resistor R3 and the capacitor C4 into the compensation current which is supplied to the node 215 to compensate for charge injection.

The operational amplifiers U1 and U2 have a high slew rate, and the resistors and capacitors have low inductance to provide a very fast response for charge injection compensation. These characteristics of the operational amplifiers U1 and U2 reduce settling time and overvoltage/undervoltage transient stressing the DUT 100.

Figure 12:
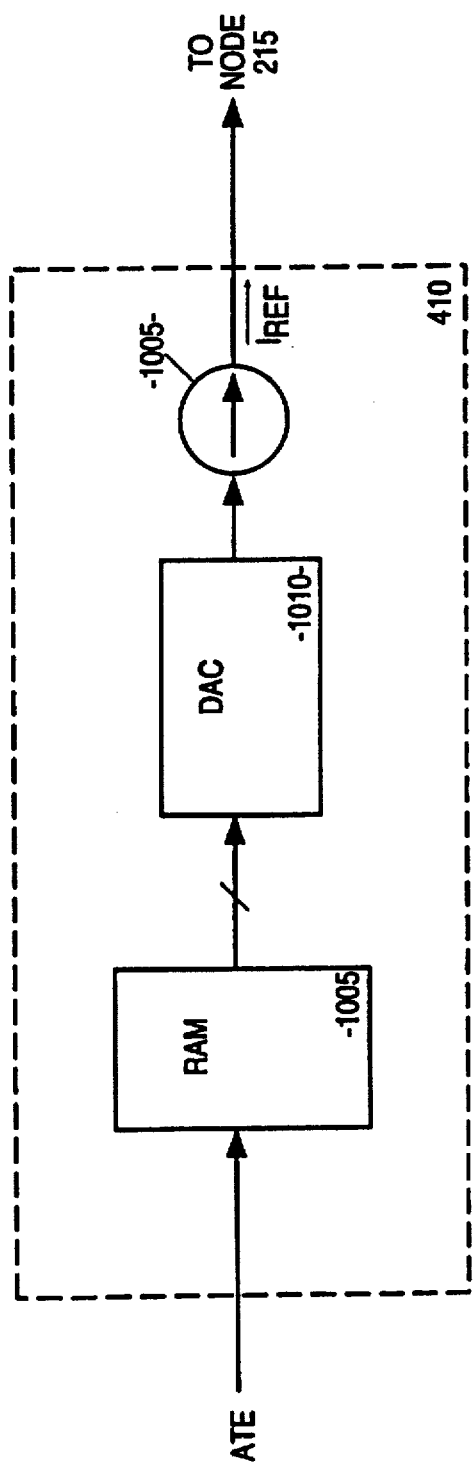
FIG. 12 shows a programmable current source of the improved $I_{DDQ}$ monitor circuit.

FIG. 12 shows the programmable current source in more detail. The programmable current source 410 includes a random access memory (RAM) 1005, a digital-to-analog converter (DAC) 1010, and a current source 1015. The RAM 1005 is used as a look-up table. When an input value is received by the RAM 1005 from the ATE, the RAM responds by performing a look-up and outputting the result of the look-up to the DAC 1005. The DAC converts the digital output signal of the RAM 1005 to an analog current. The current source 1015, which may comprise a current mirror circuit, multiplies the current output by the DAC to produce the reference current $I_{REF}$ to the node 215.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A circuit for determining a quiescent power supply current ($I_{DDQ}$) of a device under test (DUT) at a first node, comprising:

a switch circuit coupled between the first node and a power supply, the switch circuit for decoupling the power supply from the first node;

a current source coupled to the first node for providing a reference current to the first node;

a decoupling capacitor coupled between the first node and system ground, the decoupling capacitor being charged to a first node voltage;

a sample and hold circuit having an input coupled to the first node, the sample and hold circuit for sampling the first node voltage of the first node at a first time and for holding the first node voltage sampled at the first time as a reference voltage;

a comparator having a first input coupled to the first node and a second input coupled to receive the reference voltage from the sample and hold circuit, the comparator for comparing the first node voltage at a second time to the reference voltage and for indicating that the $I_{DDQ}$ of the DUT is less than the reference current if the first node voltage increases between the first and second times.

2. The circuit of claim 1, wherein the comparator indicates that the $I_{DDQ}$ of the DUT is greater than the reference current if the first node voltage decreases between the first and second times.

3. The circuit of claim 1, wherein the switch circuit comprises:

a first switch having a first resistance when switched on;

a second switch having a second resistance when switched on, wherein the second resistance is greater than the first resistance, the first switch being switched off before the second switched off when the switch circuit decouples the power supply from the first node.

4. The circuit of claim 1, wherein the switch circuit comprises:

a plurality of switches, each switch having a unique resistance when switched on, wherein a switch having a lowest resistance is switched off first and successive switches are sequentially switched off according to which switch has a next lowest resistance until all switches are switched off such that the power supply is decoupled from the first node.

5. The circuit of claim 1, wherein the circuit further comprises:

a voltage-to-current converter circuit having an input and an output coupled to the first node, the voltage-to-current converter circuit for generating a compensation current to reduce charge injection caused by decoupling the power supply is decoupled from the first node.

6. The circuit of claim 5, wherein the voltage-to-current converter circuit comprises:

a non-inverting amplifier having an input and an output, wherein the input of the non-inverting amplifier is coupled to the first node;

an inverting amplifier having an input and an output, wherein the input of the inverting amplifier is coupled to the output of the non-inverting amplifier;

a converting output stage circuit having an input and an output, wherein the input of the converting output stage is coupled to the output of the inverting amplifier, the converting output stage for converting a voltage supplied by the inverting amplifier to the compensation current; and a switch having a first pole and a second pole, wherein the first pole is coupled to the output of the converting output stage and the second pole is coupled to the first node, the switch for supplying the compensation current to the first node when the switch is closed.

7. A process for determining a quiescent power supply current ($I_{DDQ}$) of a device under test (DUT) at a first node, comprising the steps of:

providing a reference current to the first node;

decoupling a power supply from the first node;

determining a first node voltage at a first time after the power supply is decoupled from the first node;

determining the first node voltage at a second time after the first time;

indicating that the $I_{DDQ}$ of the DUT is greater than the reference current if the first node voltage decreases from the first time to the second time; and indicating that the $I_{DDQ}$ of the DUT is less than the reference current if the first node voltage increases from the first time to the second time.

8. The process of claim 7, wherein the step of determining the first node voltage at the first time comprises the steps of:

sampling a first node voltage at a first time after the power supply is decoupled from the first node; and holding the first node voltage sampled at the first time as a reference voltage.

9. The process of claim 1, wherein the step of providing a reference current to the first node comprises the steps of:

selecting a value for the reference current from a plurality of possible values; and generating the reference current in response to the value selected.

10. The process of claim 9, wherein the value of the reference current is selected to provide a guard band between a desired $I_{DDQ}$ and the $I_{DDQ}$ determined by the process.

11. The process of claim 7, wherein the step of decoupling the power supply from the first node comprises the steps of:

opening a first switch having a first resistance;

opening a second switch having a second resistance after the first switch is opened, wherein the second resistance is greater than the first resistance; and opening a third switch having a third resistance after the second switch is opened, wherein the third resistance is greater than the second resistance.

12. The process of claim 7, wherein the first node voltage is sampled after transients generated in response to the power supply being decoupled to the power supply are allowed to settle.

13. The process of claim 7, wherein the step of indicating that the $I_{DDQ}$ of the DUT is greater than the reference current comprises the step of generating a first logic signal having a first state, and the step of indicating that the $I_{DDQ}$ of the DUT is less than the reference current comprises the step of generating a second logic signal having second state.

14. A process for determining a quiescent power supply current ($I_{DDQ}$) of a device under test (DUT) at a first node, comprising the steps of:

providing a reference current to the first node;

decoupling a power supply from the first node;

sampling a first node voltage at a first time after the power supply is decoupled from the first node;

holding the first node voltage sampled at the first time as a reference voltage;

comparing the first node voltage at a second time to the reference voltage;

indicating that the $I_{DDQ}$ of the DUT is greater than the reference current if the first node voltage is less than the reference voltage; and indicating that the $I_{DDQ}$ of the DUT is less than the reference current if the first node voltage is greater than the reference voltage.

15. The process of claim 14, wherein the step of providing a reference current to the first node comprises the steps of:

selecting a value for the reference current from a plurality of possible values; and generating the reference current in response to the value selected.

16. The process of claim 15, wherein the value of the reference current is selected to provide a guard band between a desired $I_{DDQ}$ and the $I_{DDQ}$ determined by the process.

17. The process of claim 14, wherein the step of decoupling the power supply from the first node comprises the steps of:

opening a first switch having a first resistance;

opening a second switch having a second resistance after the first switch is opened, wherein the second resistance is greater than the first resistance; and opening a third switch having a third resistance after the second switch is opened, wherein the third resistance is greater than the second resistance.

18. The process of claim 14, wherein the first node voltage is sampled after transients generated in response to the power supply being decoupled to the power supply are allowed to settle.

19. The process of claim 14, wherein the step of indicating that the $I_{DDQ}$ of the DUT is greater than the reference current comprises the step of generating a first logic signal having a first state, and the step of indicating that the $I_{DDQ}$ of the DUT is less than the reference current comprises the step of generating a second logic signal having second state.

* * * * *